(12) United States Patent
Fry et al.

(10) Patent No.: US 6,986,116 B2
(45) Date of Patent: Jan. 10, 2006

(54) SIGNAL BALANCING BETWEEN VOLTAGE DOMAINS

(75) Inventors: Thomas Walker Fry, Cambridge, MA (US); Daniel Richard Menard, Arlington, MA (US); Phillip Paul Normand, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 71 days.

(21) Appl. No.: 10/248,302

(22) Filed: Jan. 7, 2003

(65) Prior Publication Data

US 2004/0133865 A1    Jul. 8, 2004

(51) Int. Cl.
*G06F 9/45* (2006.01)
*G06F 17/50* (2006.01)
(52) U.S. Cl. .............................................. 716/6; 716/2
(58) Field of Classification Search ................ 716/1–2, 716/4, 6, 18
See application file for complete search history.

(56) References Cited

U.S. PATENT DOCUMENTS

| | | | | |
|---|---|---|---|---|
| 5,655,113 A | 8/1997 | Leung et al. | ................ | 713/401 |
| 5,686,845 A | 11/1997 | Erdal et al. | .................... | 326/93 |
| 5,712,583 A | 1/1998 | Frankeny | .................... | 727/277 |
| 5,812,832 A | 9/1998 | Horne et al. | ................. | 713/501 |
| 5,878,055 A | 3/1999 | Allen | .......................... | 714/744 |
| 5,900,762 A | 5/1999 | Ramakrishnan | ............. | 327/277 |
| 5,912,820 A * | 6/1999 | Kerzman et al. | ............... | 716/6 |
| 6,091,216 A | 7/2000 | De Lange | ..................... | 326/38 |
| 6,127,844 A | 10/2000 | Cliff et al. | ..................... | 326/41 |
| 6,421,818 B1 * | 7/2002 | Dupenloup et al. | ............ | 716/18 |
| 6,453,402 B1 | 9/2002 | Jeddeloh | ...................... | 711/167 |
| 6,577,992 B1 * | 6/2003 | Tchemiaev et al. | ............ | 703/14 |
| 6,687,889 B1 * | 2/2004 | Secatch et al. | ................. | 716/6 |
| 6,693,456 B2 | 2/2004 | Wong | .......................... | 326/41 |
| 6,711,716 B1 * | 3/2004 | Mueller et al. | ................. | 716/1 |
| 2002/0073389 A1 | 6/2002 | Elboim et al. | .................. | 716/6 |
| 2003/0009734 A1 * | 1/2003 | Burks et al. | ..................... | 716/6 |

OTHER PUBLICATIONS

Carrig et al., "A New Direction in ASIC High-Performance Clock Methodology," IEEE 1998 Custom ICs Conference, pp. 593-596.*
Harris et al., "Statistical Clock Skew Modeling With Data Dealy Variations," IEEE Trans on VLSI Systems, vol. 9, No. 6, Dec. 2001, pp. 888-898.*
Jex et al., "High Speed I/O Circuit Design in Multiple Voltage Domains," 1999 IEEE, pags 424-427.*
Jex et al., "High Speed I/O Circuit Design in Multiple Voltage Domains", 1999 IEEE, pp. 424-427.

* cited by examiner

*Primary Examiner*—Leigh M. Garbowski
(74) *Attorney, Agent, or Firm*—Richard M. Kotulak

(57) ABSTRACT

A method for balancing signals across an IC design having multiple voltage domains. The method uses a voltage tress to balance the signals at the top level above the voltage domains. Then using worst case and best case signal latencies determines the average latency in each voltage domain. Then balancing signals at the other levels of the design by incrementing the latencies in each domain until a target level based on the slowest average latency is reached.

19 Claims, 3 Drawing Sheets

SIGNAL BALANCING BETWEEN VOLTAGE DOMAINS

CROSS REFERENCE TO RELATED APPLICATIONS

This application is related to another U.S. patent application Ser. No. 10/248,301 IBM Docket Number BUR920020136US1, entitled "Programmable Delay Method for Hierarchical Signal Balancing," which is filed concurrently with this application by the same assignee and is incorporatated herein by reference.

BACKGROUND OF THE INVENTION

1. Field of the Invention

This invention relates generally signal balancing, specifically to a method, system and software for balancing signals spanning multiple voltage domains.

2. Background of the Invention

The semiconductor industry is constantly increasing the number of circuits and functionality that can be compressed onto a single die. As process dimensions decrease, this ability has grown at an astronomical rate. The ability to put entire functioning systems on a single die is now the norm rather than the exception. As a consequence of this growth, the die/integrated circuit can be viewed as compilation of functioning islands.

Some of these islands operate at different voltages from one another, others have the ability to switch to standby or sleep mode, while still others result from the need to isolate noisy circuitry. The ability to combine these different islands onto a single integrated circuit, requires techniques and circuitry for propagating communication (clocks, signals, etc), power, and output results.

In a design without Voltage Islands, the entire signal operates on identical power rails. Even though the voltage varies between best case ("BC") and worst case ("WC") conditions, every buffer on the power rail is assumed to operate at an identical voltage for balancing purposes. However, with the use of Voltage Islands signal buffers are powered by separate power rails. As a result the signal's buffers operate at various voltage conditions between voltage islands and voltage domains to be balanced.

BRIEF SUMMARY OF THE INVENTION

Summary of the Invention

This invention is a method and media to balance signals operating on multiple power rails and thus multiple voltage conditions. Additionally it provides methods of modeling the resulting signal skew.

The invention for balancing signals across an voltage island domain in an IC design comprises the steps of balancing signals at heirarchial levels above the voltage domains and balancing signals at the other levels in the design as a function of varying operating conditions across the voltage domains in the IC.

DETAILED DESCRIPTION OF THE INVENTION

Voltage Islands complicate signal balancing for two primary reasons: 1) The signal is divided among multiple Random Logic Macros (RLMs) while design, layout and balance routing is performed independently within each RLM. During operation the voltage level within each Voltage Island independently floats between Best Case (BC) and Worst Case (WC) conditions resulting in signal latencies within each Voltage Domain which vary independently of each other over a known range. Signal arrival times can vary by over 20% of the total signal's latency as voltage levels float between BC and WC conditions. The independent floating of voltage levels between separate voltage domains introduces additional skew. As a result, the goal of signal balancing in Voltage Island designs is to balance the signal over all possible combinations of operating conditions, instead of one specific condition.

Figure 1:
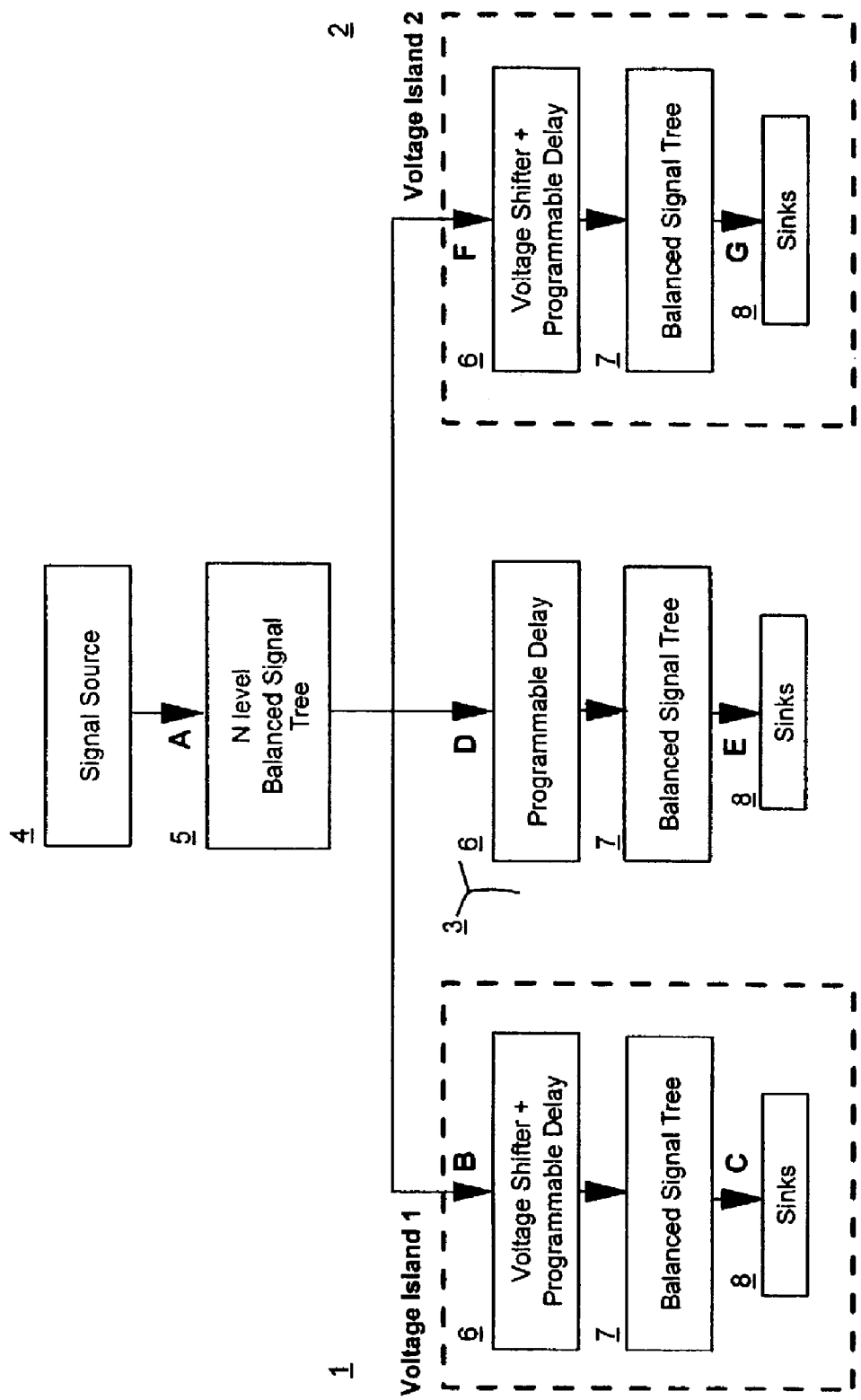
FIG. 1 is a block diagram that schematically illustrates a structure of a balanced signal spanning multiple Voltage Domains.

FIG. 1 illustrates an example of a signal extending through two voltage domains 1 and 2 and the top level of the design 3. The objective is to balance the signal's arrival time at each sink 8 throughout the heirarchy of the design, regardless of the voltage condition at the top level or any Voltage Island. The signal tree is inserted and balanced separately within each Voltage Island assuming WC voltage in all voltage domains. The result is a balanced signal from point A to points B, D, and F in FIG. 1, regardless of the voltage condition at the top level or at any Voltage Island. The signal's latency along these three paths from source 6 to sinks 8 are only affected by the voltage condition of the top level. As the top level's voltage varies between BC and WC conditions, the signal's arrival time at points B, D, and F are assumed to stay balanced. As a result, these points 6 are referred to as "equivalent" or common starting points for the rest of the tree.

For the rest of the tree, paths Bâ†'C, Dâ†'E, and Fâ†'G (cell paths 6 to 8) are balanced within each voltage domain, but not to each other. In other words, the signal's arrival time matches for all sinks at point C. However, point C is not balanced to points E or G. If the signal's latency through each of these three paths is balanced at one specific voltage condition (for example WC voltage), a well-balanced signal tree is produced only if all three voltage domains operate at the specific voltage condition. As the voltage within each Voltage Island floats between BC and WC conditions, the sinks 8 across the global design experience additional skew.

The objective of signal balancing in Voltage Island designs is to globally balance the signal's latency over every possible voltage condition. To accomplish this, the balancing tool of this invention examines the signal's latency at BC and WC conditions in each Voltage Island, and calculates the mid-point of each Voltage Island. This mid-point is considered the "average latency" for each path. (Note: The "average latency" is not the nominal case, the average latency depends solely on the BC and WC conditions.) The delay of the programmable delay element on each path is progressively increased until the "average latency" matches an initial target. Normally the initial target is the slowest average latency.

During each stage of balancing, the BC and WC voltage conditions are reevaluated to calculate an updated average latency. By balancing to the average latency, signal skew is minimized when individual Voltage Islands operate at the edges of their operational range (i.e. BC or WC voltage). The final result is a signal optimally balanced for any combination of voltage conditions, but not necessarily balanced at a specific voltage condition.

A major advantage of this method is it is possible to change a voltage island's operational voltage range after design work is complete. This is possible since the signal latency is still adjustable because of the ease in reprogramming the delay elements. So, preferably the invention employs the method described in copending application "Programmable Delay Method for Hierarchical Signal Balancing" to make it possible to implement automated balancing routines.

After the chip design is complete but prior to fabrication, the programmable delay elements' functionality is fixed. Doing so turns the programmable delay elements into fixed blocks of delay where the amount of delay added is optimized for each signal branch. However, this invention does not depend upon the programmable delay methods. For example once latency targets between Voltage Islands have been calculated, it is also possible to balance the signal manually without programmable delay elements.

The following example shows example BC and WC latencies (based on experimentation) for paths B†'C, D†'E, and F†'G shown in FIG. 1. For the given example assume the Voltage Islands operate at a higher voltage than the global design resulting in faster signal propagation. As mentioned previously, because the signal's arrival times at points B, D, and F are considered equivalent, only the latency of each path from the equivalent starting points are considered. Using the latency from the common starting points removes any dependency between the top-level voltage domain and the voltage islands during balancing.

TABLE 1

Initial Average Latency Calculation

| Path | BC Latency | WC Latency | Avg. Latency |
|---|---|---|---|
| B→C | 0.85 | 1.05 | 0.95 |
| D→E | 0.90 | 1.30 | 1.10 |
| F→G | 0.65 | 0.85 | 0.75 |

Table 1 displays average signal arrival times within each Voltage Island. In the example shown paths B†'C and F†'G are faster than the signal's arrival time at the top level. The slowest average latency, 1.10 ns, is selected as the target for balancing. During balancing the algorithm incrementally increases the delay along each Voltage Island as it attempts to optimally match each voltage domain's average latency. After each delay increment the algorithm reevaluates the BC and WC latencies to recalculate updated average latency values.

TABLE 2

Nth-Pass Average Latency Calculation

| Path | BC Latency | WC Latency | Avg. Latency |
|---|---|---|---|
| B→C | 1.00 | 1.20 | 1.10 |
| D→E | 0.90 | 1.30 | 1.10 |
| F→G | 0.85 | 1.05 | 0.95 |

After several more iterations the latency of path B†'C matches the 1.10 ns target as close as possible. However, as shown in Table 2 the latency along path F†'G, Voltage Island 2, requires further processing. After some additional adjustments the average latency of path F†'G matches the original path. This is shown in Table 3. Note: To simplify the current example, no design skew was introduced and an assumption is made that perfect balancing is possible. Design skew is the difference in average latency due to imperfect balancing between domains plus any standard design skew. In an actual design there is slight average latency mismatch yielding additional design skew.

TABLE 3

Final-Pass Average Latency Calculation

| Path | BC Latency | WC Latency | Avg. Latency | Voltage Jitter |
|---|---|---|---|---|
| B→C | 1.00 | 1.20 | 1.10 | 0.10 |
| D→E | 0.90 | 1.30 | 1.10 | 0.20 |
| F→G | 1.00 | 1.20 | 1.10 | 0.10 |

The concept of "Voltage Jitter" is introduced in Table 3. Voltage Jitter is the maximum amount a signal's arrival time can deviate from the average latency due to the voltage level floating between BC and WC conditions. For example, the latency of path D†'E varies at most ±0.2 ns from the 1.10 ns target. Voltage Jitter does not effect sinks within a single voltage domain since all signal paths in a voltage domain operate at identical voltage conditions in any given time. However when considering timing between voltage domains, skew increases by the Voltage Jitter of each voltage domain plus any design skew between the domains.

In the example shown in Table 3, the maximum additional skew is 0.30 ns (0.1 ns B†'C voltage jitter+0.2 ns D†'E voltage jitter+0.00 ns design skew between B†'C and D†'E. Note: As stated in the above paragraph for this example, there is no design skew. This an unlikely event in a real design. However, one can see how, in an actual design, design skew is considered. The maximum additional skew is evident when path D†'E operates at BC voltage (0.9 ns) and path B†'C operates at WC voltage (1.2 ns). Note that the 0.3 ns difference is less than the 0.4 ns range in arrival times for sinks at point E, which vary between 0.9 ns and 1.3 ns. The improvement is possible because balancing considered both BC and WC timing modes, rather than just a single timing mode.

Table 4 shows two signal balancing examples and the corresponding range of signal arrival times. The last two columns illustrate balancing at a specific operating condition. Here the voltage domains were balanced assuming each voltage domain operates at WC voltage. During operation if every voltage domain operates at WC voltage, total signal skew due to voltage effects is non existent. However, if path D—>E shifts to BC voltage, sink latencies vary from 0.90 ns to 1.30 ns, resulting in 0.40 ns of signal skew due to voltage effects, which is 33% worse than balancing to the average latency.

TABLE 4

Two Signal Balancing Examples: Average Latency versus Worst Case Latency

| Balancing to Average Latency: Skew = 0.30 ns | | Balancing to Worse Case Latency: Skew = 0.40 ns | |
|---|---|---|---|
| Path | Range | Path | Range |
| B→C | 1.10–1.20 | B→C | 1.10–1.30 |
| D→E | 0.90–1.30 | D→E | 0.90–1.30 |
| F→G | 1.10–1.20 | F→G | 1.10–1.30 |

Figure 2:
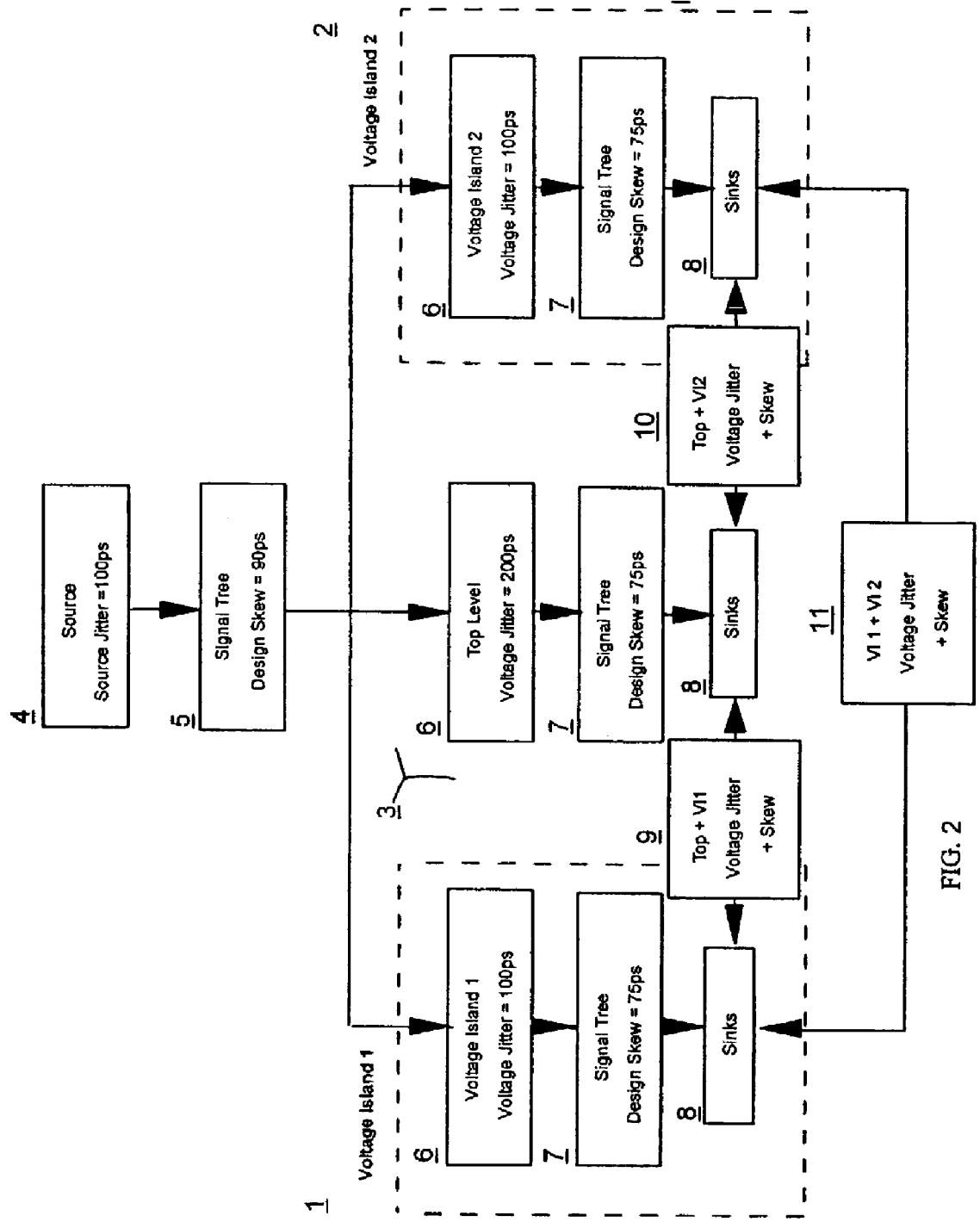
FIG. 2 is a block diagram that schematically illustrates sources of signal skew.

FIG. 2 shows an example of how to model separate sources of signal skew across Voltage Islands. Design skew values represent the standard skew found in hierarchical designs without the use of voltage islands and are caused by the combination of unbalanced wiring and RLM signal latency mismatches 5 and 7. Once voltage islands are introduced, Voltage Jitter 6 must also be considered. Signals traversing a voltage domain experience the effect of both domains' Voltage Jitter components. In this example, the additional skew for a signal traveling between Voltage Island 1 and the top level is: 100 ps+200 ps=300 ps. Signals which do not traverse a voltage domain, are not required to consider Voltage Jitter components since all relevant signal paths operate at an identical voltage level.

However, signals which travers voltage domains 9, 10, and 11 must take into account all sources of design skew, source jitter and voltage jitter. Note, voltage jitter represents over half of the skew on a balanced signal making it the primary source of overall skew. This highlights how dominating the voltage jitter component is, i.e. how much worse signal balancing is because of voltage jitter, and thus why it has to be considered. Since voltage jitter is just how much the latency of a signal's path can vary from the 'average latency' because of voltage effects, voltage jitter is just an easy method to look at and understand the effect voltage drift on power rails have on balancing.

Figure 3:
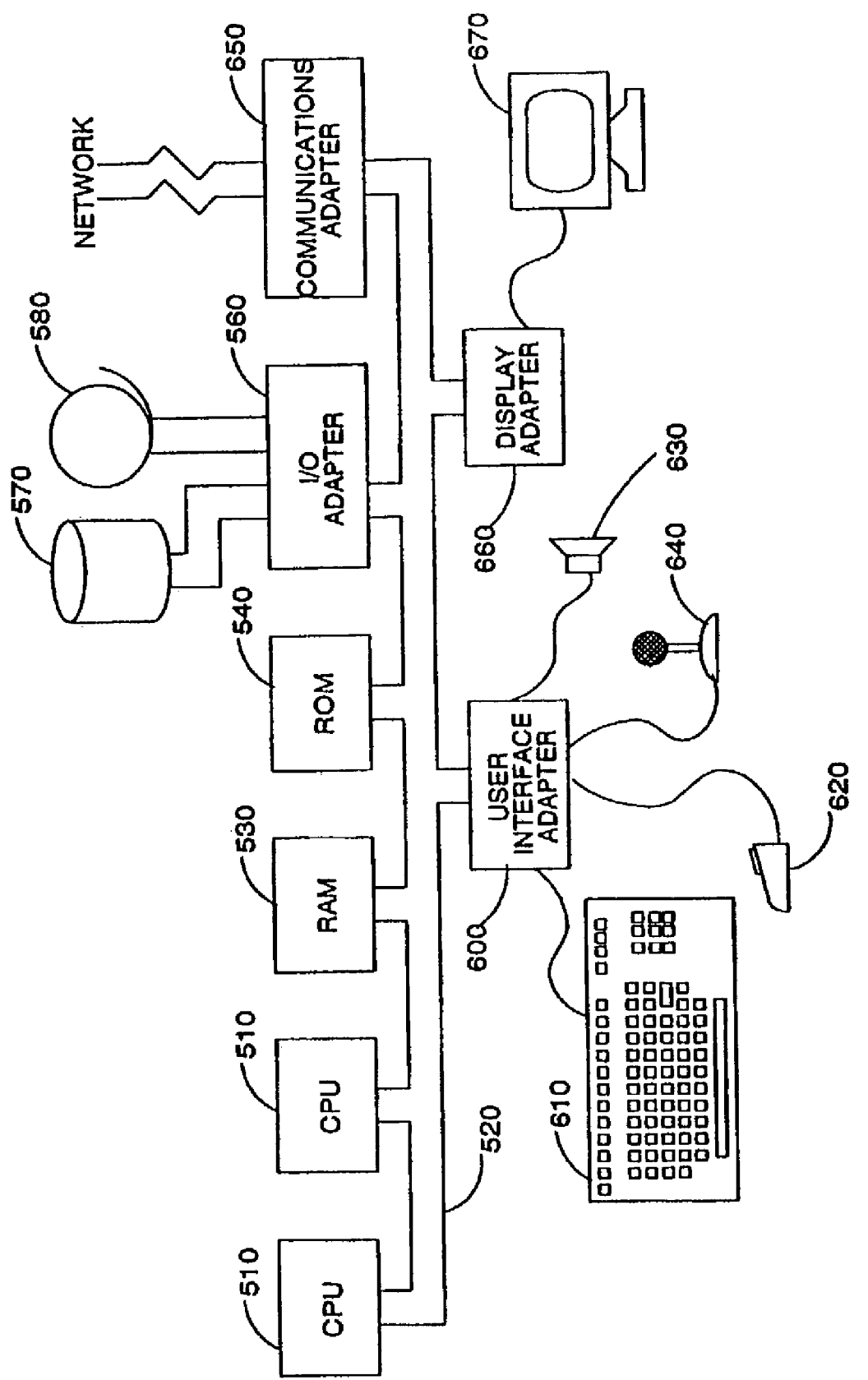
FIG. 3 is a diagram in schematic form that represents a typical computer system hardware environment for practicing this invention.

A representative hardware environment for practicing the present invention is depicted in FIG. 3, which illustrates the typical hardware configuration of a computer system capable of performing the signal balancing in accordance with the present invention. The typical environment has at least one processor or central processing unit (CPU) 510. CPUs 510 are interconnected via system bus 520 to a random access memory (RAM) 530, read-only memory (ROM) 540, an input/output (I/O) adapter 560 for connecting peripheral devices such as disk units 570 and tape drives 580 to bus 520, user interface adapter 600 for connecting keyboard 610, mouse 620, speaker 630, microphone 640, and/or other user interface devices such as touch screen device (not shown) to bus 520, communication adapter 650 for connecting the information handling system to a data processing network, and display adapter 660 for connecting bus 520 to display device 670. The design system comprising the design information needed for this invention, libraries, simulation and verification software can be loaded on the appropriate disk or tape units or fed either through I/O adapters or the network for processing. A computer program with an appropriate application interface could be created by one of skill in the art and stored on the system to simplify the practicing of this invention.

It is thus believed that the operation and construction of the present invention will be apparent from the foregoing description. The description of the embodiments of the present invention is given above for the understanding of the present invention. It will be understood that the invention is not to the particular embodiments described herein, but is capable of various modifications, rearrangements and substitutions will now become apparent to those skilled in the art without departing from the scope of the invention. Therefore it is intended that the following claims cover all such modifications and changes as fall within the true spirit and scope of the invention.

What is claimed is:

1. A method for balancing signals across a voltage island domain in an IC design comprising the steps of:
    balancing signals at hierarchical levels above the voltage domains; and
    balancing signals at other levels in the design as a function of varying operating conditions across the voltage domains in the IC.

2. The method of claim 1 wherein the varying operating conditions are worst case and best case conditions.

3. The method of claim 2 also comprising the step of calculating the average latency for paths in the voltage domains.

4. The method of claim 3 wherein the average latency is the mid-point between the worst case and best case conditions.

5. The method of claim 3 also comprising the step of iteratively increasing the delay in the paths of the voltage domains to match a target delay.

6. The method of claim 5 wherein the target delay is determined by examining an average latency of each voltage domain and choosing the slowest latency.

7. The method of claim 5 wherein the best case and worst case conditions are determined after the step of iteratively increasing the delay and the average latency is recalculated based on the conditions.

8. The method of claim 5 wherein the step of iteratively increasing the delay occurs through the use of programmable delay elements.

9. The method of claim 1 where in the signals are clock signals.

10. A method for balancing signals across an IC design having multiple voltage domains comprising the steps of:
    balancing signals at hierarchical levels above the voltage domains;
    determining the average latency inside each voltage domain; and balancing signals at the other levels in the design by incrementing programmable delay elements with the goal of having the signal latency in each voltage domain balanced as reasonably possible over combinations of operating conditions in each voltage domain.

11. A program storage device readable by machine, tangibly embodying a program of instructions executable by the machine to perform method steps for balancing signals across voltage domains in an integrated circuit design, the method comprising the steps of:

balancing signals at hierarchical levels above the voltage domains; and balancing signals at other levels in the design as a function of varying operating conditions across the voltage domains in the IC.

12. The method steps of claim 11 wherein the varying operating conditions are worst case and best case conditions.

13. The method steps of claim 12 also comprising the step of calculating the average latency for paths in the voltage domains.

14. The method steps of claim 13 wherein the average latency is the mid-point between the worst case and best case conditions.

15. The method steps of claim 13 also comprising the step of iteratively increasing the delay in the paths of the voltage domains to match a target delay.

16. The method steps of claim 15 wherein the target delay is determined by examining an average latency of each voltage domain and choosing the slowest latency.

17. The method steps of claim 15 wherein the best case and worst case conditions are determined after the step iteratively increasing the delay and the average latency is recalculated based on the conditions.

18. The method steps of claim 15 wherein the step of iteratively increasing the delay occurs through the use of programmable delay elements.

19. A program storage device readable by machine, tangibly embodying a program of instructions executable by the machine to perform method steps for balancing signals across voltage domains in an integrated circuit design, the method comprising the steps of:

balancing signals at hierarchical levels above the voltage domains;

determining the average latency inside each voltage domain; and balancing signals at the other levels in the design by incrementing programmable delay elements with the goal of having the signal latency each voltage domain balanced as reasonably possible over combinations of operating conditions in each voltage domain.

* * * * *

UNITED STATES PATENT AND TRADEMARK OFFICE
CERTIFICATE OF CORRECTION

| | | |
|---|---|---|
| PATENT NO. | : 6,986,116 B2 | Page 1 of 1 |
| APPLICATION NO. | : 10/248302 | |
| DATED | : January 10, 2006 | |
| INVENTOR(S) | : Thomas Walker Fry, Daniel Richard Menard and Phillip Paul Normand | |

It is certified that error appears in the above-identified patent and that said Letters Patent is hereby corrected as shown below:

Col2, line 54 should read

For the rest of the tree, paths B→C, D→E, and F→G

Signed and Sealed this

Twenty-fourth Day of April, 2007

JON W. DUDAS
*Director of the United States Patent and Trademark Office*